United States Patent
Baert et al.

Patent Number: 5,287,294
Date of Patent: Feb. 15, 1994

[54] APPARATUS AND METHOD FOR AUTOMATICALLY CALIBRATING FOR TEMPERATURE AN INPUT TRAY OF AN INTEGRATED CIRCUIT HANDLER

[75] Inventors: Victor R. Baert, Ramsey; Scott D. Elfstrom, North St. Paul; Teddy P. Williams, St. Paul, all of Minn.

[73] Assignee: Micro Component Technology, Inc., Minneapolis, Minn.

[21] Appl. No.: 702,945

[22] Filed: May 20, 1991

[51] Int. Cl.⁵ .................................. G01K 13/04
[52] U.S. Cl. ........................................ 364/557
[58] Field of Search .................................. 364/557

[56] References Cited

U.S. PATENT DOCUMENTS

| | | | |
|---|---|---|---|
| 4,675,826 | 6/1987 | Gentry et al. | 364/557 |
| 4,734,872 | 3/1988 | Eager et al. | 364/557 |
| 4,782,445 | 11/1988 | Pasquini | 364/557 |
| 4,817,009 | 3/1989 | Jenson et al. | 364/557 |
| 4,907,177 | 3/1990 | Curreri et al. | 364/557 |
| 4,979,134 | 12/1990 | Arima et al. | 364/557 |
| 4,982,347 | 1/1991 | Rackerby et al. | 364/557 |
| 5,012,415 | 4/1991 | Boe et al. | 364/571.01 |
| 5,025,248 | 6/1991 | Bergeron | 364/557 |

*Primary Examiner*—Jack B. Harvey
*Assistant Examiner*—Jae H. Choi
*Attorney, Agent, or Firm*—Lawrence M. Nawrocki

[57] ABSTRACT

A system for calibrating the input tray of an integrated circuit handling device for temperature. The system includes a plurality of fixed sensors mounted at locations along the input tray of the handling device. The fixed sensors serve to sense temperatures within defined zones corresponding to the locations at which the fixed sensors are positioned. Various heaters are also included, and these heaters adjust temperature within the defined zones in response to temperature readings sensed by the fixed sensors. Each of a plurality of thermocouple sensors is received within an integrated circuit body. Such an IC body-carried thermocouple sensor is positionable at a location along the input tray of the handling device at a location closely proximate the location of a fixed sensor. Such thermocouple sensors serve to sense the actual temperature to which an IC passing along the input tray would be exposed as it passes through a zone defined by a corresponding fixed sensor. An automatic processor is included, the processor being programmed to receive information from the thermocouple sensors and to adjust the stated sensed temperatures of corresponding fixed sensors to correspond to actual temperatures sensed by the thermocouple sensors.

3 Claims, 4 Drawing Sheets

APPARATUS AND METHOD FOR AUTOMATICALLY CALIBRATING FOR TEMPERATURE AN INPUT TRAY OF AN INTEGRATED CIRCUIT HANDLER

TECHNICAL FIELD

The present invention is related broadly to a technology dealing with structures for feeding integrated circuit devices to a test site interfacing with a tester for testing the devices and evaluating the functions thereof. More narrowly, however, the present invention is directed to structures and methods involved in heating the devices to temperature conditions at which they will ultimately operate so that the evaluation performed on the devices will have a maximum level of validity. The specific focus of the invention is the calibration for temperature of an input tray of an integrated circuit handler so that desired temperature points in the tray can be reliably achieved.

BACKGROUND OF THE INVENTION

Since the genesis of the integrated circuit, various types of devices have evolved. Such devices typically include DIP's (dual in-line packages), SOIC's (small outline integrated circuits), PLCC's (plastic leadless chip carriers), etc. Such devices have innumerable applications in industry and commerce.

With many of the applications to which such devices can be put, it is essential that the devices be accurate to at least a minimum defined percentage of accuracy. In some applications, of course, it is essential that the devices be virtually one hundred percent accurate. In other applications, however, a reliability, for example, of eighty percent might be acceptable if certain critical circuit paths are completely accurate.

The manufacturing processes employed in creating integrating circuits do, as in the case of other manufacturing processes, produce units of different quality. For this reason, it is necessary to test the items (that is, effect quality control). Such testing is performed not only to answer the question of whether or not the devices are merely operable to any degree, but also to classify the units by degree of operability.

Various testing devices have been developed in order to perform such quality control operations. Typically, such testers perform testing at high rates of speed. Handling devices have also been developed which, it is intended, are capable of feeding integrated circuits to a test site interfacing with the tester. Such handler equipment should, of course, feed the devices to the test site rapidly, and they should also convey the devices to be tested away from the test site at a high rate of speed.

A number of high-speed handlers have been developed to achieve these goals. In order to facility ever increasing speed requirements, multiple test site handlers have been designed.

Depending upon the type and nature of the device and the application in which the device is to be used, an integrated circuit will be subjected to different ambient operating temperatures. In one application, a device to be tested might ultimately function in an environment with a temperature significantly higher than room temperature. On the other hand, however, another device might ultimately be intended to function in an environment with a temperature significantly lower than ambient temperature.

A particularly important feature of a handler is one whereby an input tray of the handler is brought to a temperature so that integrated circuits fed therethrough are elevated or depressed to the temperature of the environment in which the devices are intended to ultimately operate. One manner in which the prior art has attempted to accomplish this goal is by providing an input tray which functions as a temperature chamber. The temperature in the chamber can be elevated or lowered by introducing a gas to the effects of which the integrated circuit devices are subjected as they pass through the chamber defining the tray. An appropriate gas is injected into the chamber to lower the temperature below a desired set point. The gas, itself, has no function in actually adjusting the temperature. Electrical heaters, however, are provided to heat the integrated circuits on the tracks within the chamber. Since the initial temperature achieved by the gas is below the desired temperature, the heaters raise, and discriminately adjust, the temperature to the desired level.

Regardless of the method of achieving a desired temperature, however, it is important that the temperature sought to be achieved be, in fact, within a close tolerance range. It is important that an operator of the machine be able to rely upon the machine being properly calibrated for temperature so that the integrated circuit devices will be able to be determined to have been accurately tested. Testing under the proper temperature conditions is, of course, a significant factor in this reliance.

In the prior art, calibration of a handler has been a long drawn-out and tedious process. Heretofore, intervention of the machine's operator has been necessary at various stages of the calibration evolution. As a result, it is not uncommon for the full temperature calibration process to take up to four to eight hours. As can be seen, a significant block of man hours is consumed in effecting calibration. Certainly, time could be better utilized if the process took less time.

It is to these problems and dictates of the prior art that the present invention is directed. The present invention is an improved apparatus and method for effecting temperature calibration of an integrated circuit handler which feeds devices to be tested to a test site which interfaces with an IC tester.

SUMMARY OF THE INVENTION

The present invention is both an apparatus and a method employing the apparatus invention. The apparatus invention includes a plurality of sensors received within bodies of integrated circuit devices intended to be handled by an integrated circuit handling device, typically, for feeding such devices to a test site interfacing with a tester apparatus. The integrated circuit bodies carrying the sensors are positioned one at each of a plurality of locations within the input tray of the integrated circuit handling device to sense a temperature within a defined zone of which the particular sensor location is representative. The apparatus further includes means for adjusting temperature within a defined zone and means for automatically actuating such temperature adjusting means in response to temperatures sensed within the defined zones. As a result, a desired temperature within the zones is automatically achieved.

In the preferred embodiment of the invention, the actuating means can take the form of preprogrammed processor means. It is intended that a personal computer be employed for this purpose.

The method invention comprises employing a calibration mechanism as defined above to effect automatic calibration for temperature of an input tray of an integrated circuit handling device. The method can also include a step of appropriately programming the actuating means, or personal computer, to effect automatic heating or cooling of the input tray to the desired set points, or temperatures, at which calibration is desired.

The present invention is thus an improved apparatus and method for effecting automatic calibration for temperature of an input tray of an integrated circuit handling device. More specific features and advantages obtained in view of those features will become apparent with reference to the DETAILED DESCRIPTION OF THE INVENTION, appended claims, and accompanying drawing figures.

DETAILED DESCRIPTION OF THE INVENTION

Figure 1:
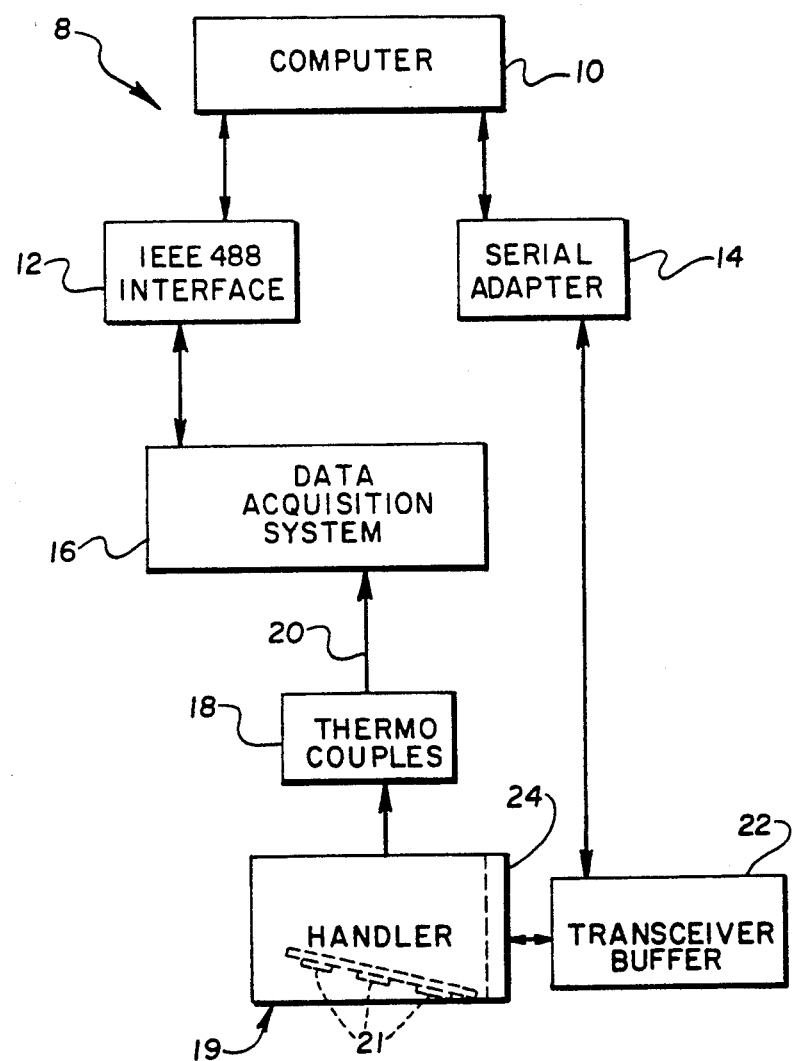
FIG. 1 is a block diagram schematic illustration of the various components of the present apparatus invention.

Referring now to the drawings, wherein like reference numerals denote like elements throughout the several views, FIG. 1 illustrates, in block diagram form, a system 8 in which the present invention is practiced. The system includes a computer console 10. Typically, the console 10 would comprise a personal computer of any appropriate type. It has been found that an IBM AT-type computer is appropriate for use in practicing the invention.

The system 8, further, includes an IEEE 488 interface printed circuit board 12. The printed circuit board 12 plugs into the back of the computer console 10, as does a serial adaptor circuit board 14. Typically, an EIA 485 serial adaptor printed circuit board 14 would be employed. These two printed circuit boards 12, 14 effect interfacing between the computer console 10 and the other components of the system 8 through appropriate cabling.

The IEEE 488 circuit board 12 is connected to a data acquisition subsystem 16. It is intended that a 3421 multiplex, 10-channel system be employed for this purpose.

The system 8, further, employs a plurality of thermocouples 18. One thermocouple is embedded in an integrated circuit device, and each of such devices having a thermocouple embedded therein is positioned in one of a plurality of zones within a housing encircling the input tray of a handler device 19. Typically, ten zones are defined, and an integrated circuit device having a thermocouple embedded therein is positioned in each of these ten zones. A T-type thermocouple is appropriate for such use.

The data acquisition subsystem 16 interfaces with each of the thermocouples 18. This is accomplished through connection and transmission cable 20.

The data acquisition subsystem 16 also connects to the computer console 10. This is accomplished through the IEEE 488 interface cable 12.

The integrated circuit devices having thermocouples embedded therein are, as previously discussed, placed at strategic locations throughout the input tray. The locations selected are functions of points at which temperature measurement is desired.

The input tray is identified by a housing which encircles the tracks to define a sealed chamber. The temperature within the chamber is elevated or lowered, depending upon the environmental temperature at which integrated circuit devices to be tested are intended to ultimately operate. Temperature ranges can vary between as much as $-55°$ C., at the low end, and $+155°$ C., at the upper end. Any conventional means for effecting temperature variation, as known in the prior art, is appropriate.

As will be understood, in view of this disclosure, that heating or cooling of the chamber is accomplished in order to create an environment similar to that, as previously discussed, in which the integrated circuits to be tested are to ultimately reside. The environment once created, receives the devices to be tested, and the devices "soak" within the environment for a period of time to allow them to achieve the temperature before they are singulated (that is, isolated) for transmission to the test site for interfacing with the tester apparatus.

The serial adaptor board 14 is connected to a transceiver buffer board 22. The transceiver buffer board 22 is, in turn, connected to a temperature controller board 24 at the handler 19.

During calibration, temperatures within the various zones of the handler input tray housing chamber are measured by employment of the thermocouples 18. The temperature sensed by the thermo couples are transmitted to the data acquisition subsystem 16 and, thereafter, to the computer console 10. The computer console 10 is programmed so as to receive information from the data acquisition subsystem 16, through the IEEE 488 interface board 12. The computer console 10, in turn, processes the received information and, automatically, in view of the programming, transmits, through the serial adaptor board 14, to the transceiver buffer board 22 actuation and control signals. The transceiver buffer board 22, in turn, translates a signal to allow temperature controller board 24 to initiate temperature changes. That is, if gas/electrical temperature control means are provided in the handler, those same means are employed for controlling temperature in the present system, in combination with the temperature controller board 24 as prompted by the computer console 10 via the transceiver buffer board 22. No additional retrofit of the existing handler 19 is necessary other than change of a single EPROM.

Figure 2A:
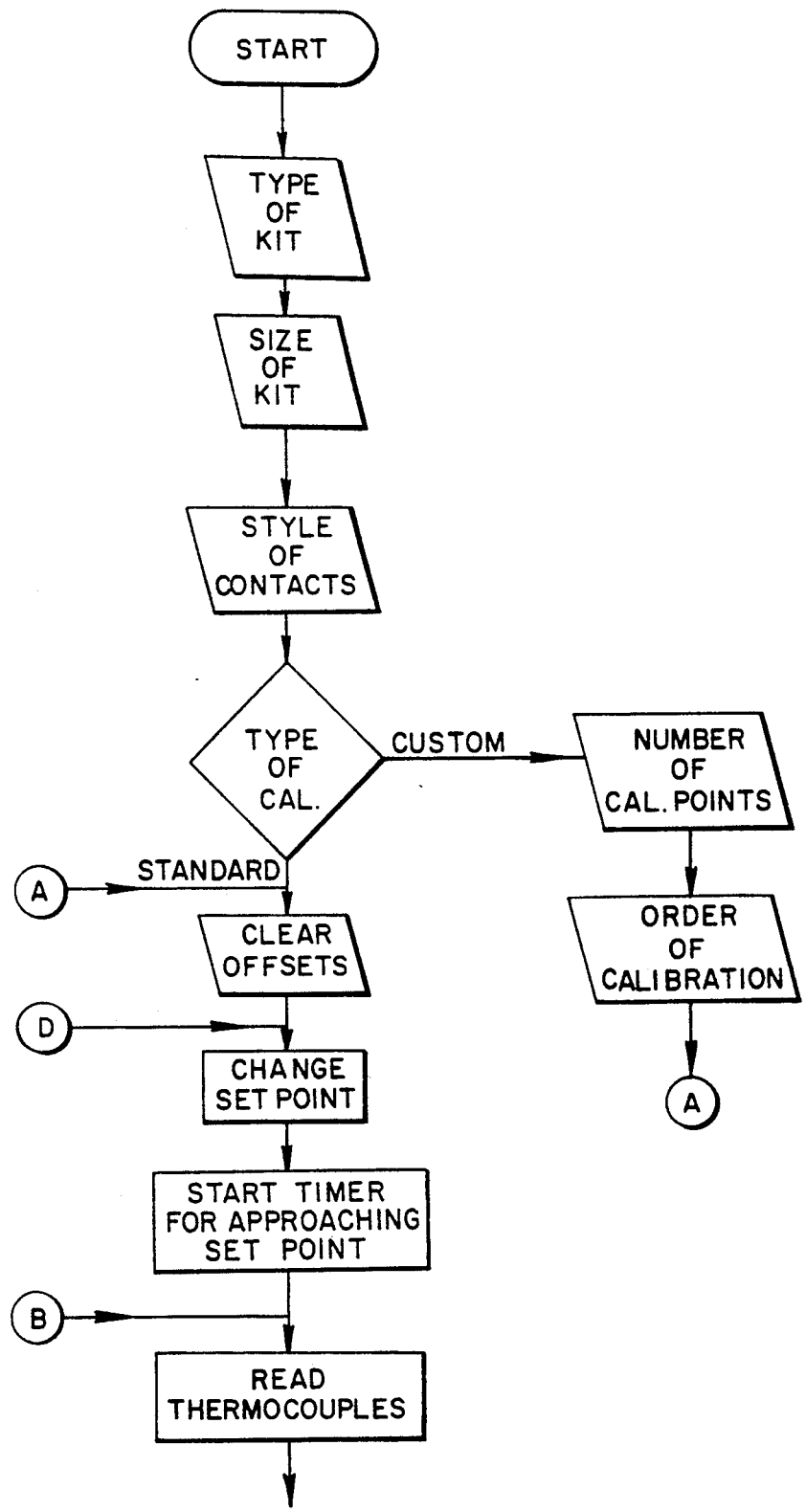
FIG. 2a is a first portion of a flow diagram illustrating the steps performed in the calibration process.
Figure 2B:
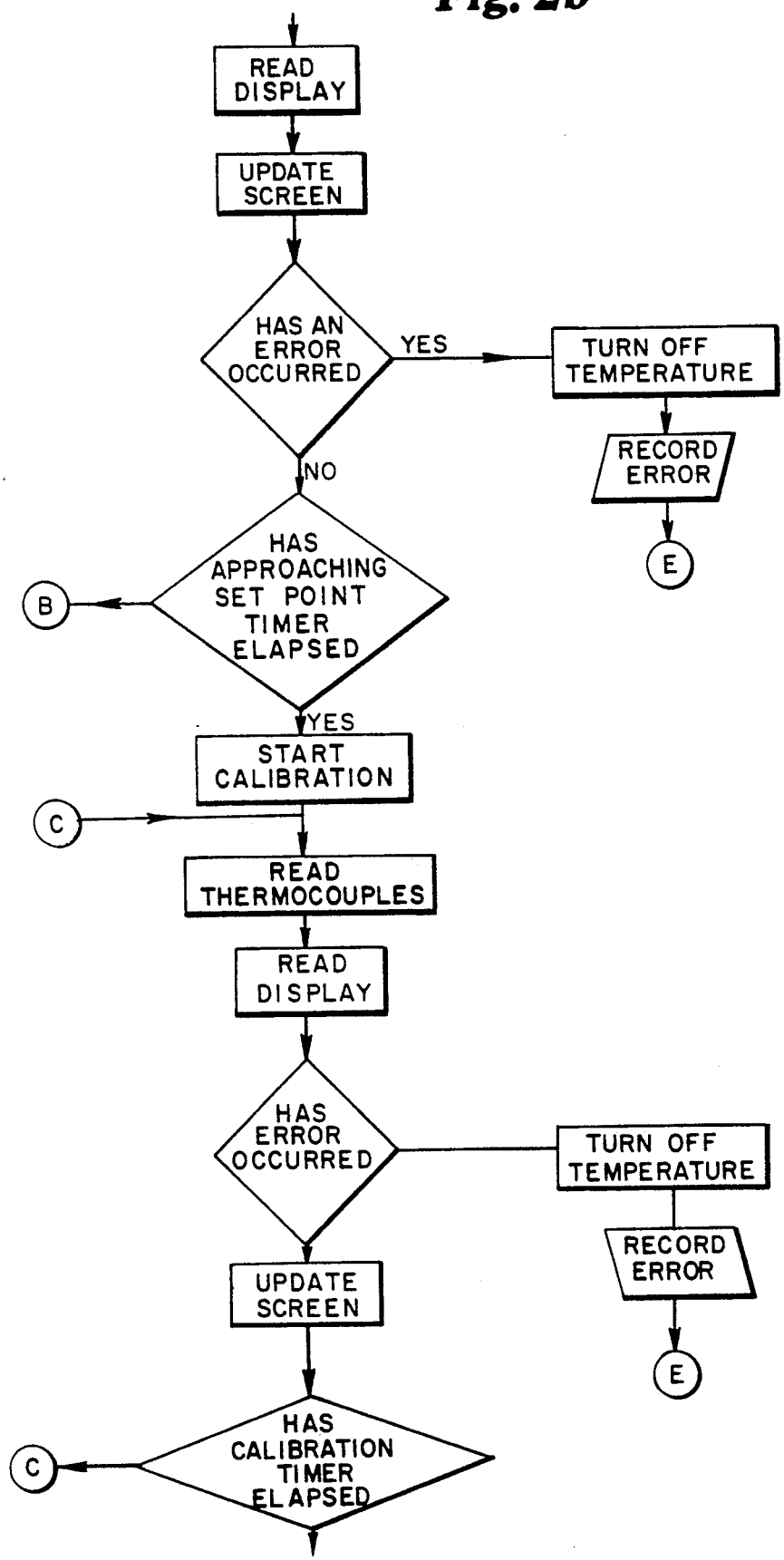
FIG. 2b is a second portion of a flow diagram illustrating the steps performed in the calibration process.
Figure 2C:
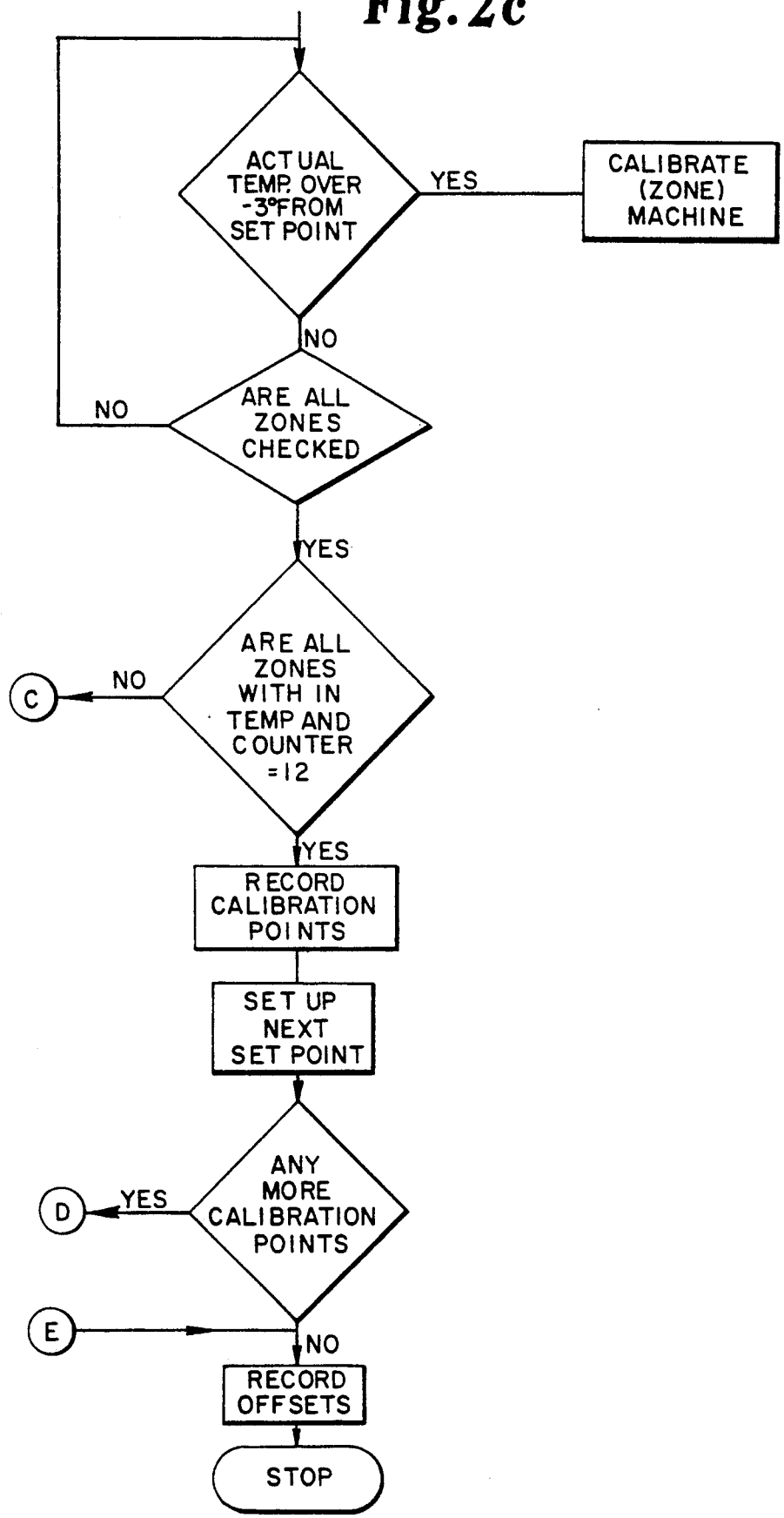
FIG. 2c is a third portion of a flow diagram illustrating the steps performed in the calibration process.

Referring now to FIGS. 2a-2c, the sequence of computer-generated decisions and operation will now be discussed. Initially, the operator of the computer console 10 has a number of selections to input into the system 8. Depending upon the type of integrated circuit being handled by the handler apparatus 19, the internal structures for accommodating the devices will be different. For example, hardware and fixtures for the handler 19 will vary depending upon whether DIP'S, SOIC'S, or some other type of integrated circuits are being tested. The hardware and fixtures will have previously been installed, and the operator makes a selection on the console 10 depending upon the hardware and fixtures being employed.

The next selection deals with the size of the kit. As the choices vary in view of the type of integrated circuit being handled, they vary also in view of the size of device.

Similarly, choices are available depending upon the style of contacts that the integrated circuit device has. In certain applications, high-frequency contacts are employed, in others, the choice may focus upon retractability of contacts, etc. In any case, however the type or style of contacts, impacts upon the calibration.

The final initial step which must be manually implemented utilizing the present system is selecting the type of calibration. Basically two choices are available. The first choice is "standard calibration". This method of calibration enables the computer console 10 to calibrate for certain standard defined set points. For example, a standard calibration may involve calibration for +5° and −45°, verifying for −55°, calibrating for +75° and +125°, and verifying for +155°. It will be understood, however, that other calibration and verification temperatures could be defined as "standard calibration". The specific temperatures could, of course, be programmed into the computer 10.

The second type of calibration is "custom calibration". if this type of calibration is desired, the operator of the system must, in addition to selecting custom calibration, define, using the computer's keyboard, the number of calibration points, the set points, and the order of calibration. In the case of custom calibration, the various points are established each time set-up is initiated.

FIG. 2a, in the "custom calibration" branch, illustrates "A" in a circle. It will be noted that, after custom calibration is completed, the system jumps back to the same location in the flow path to place the system in a calibration mode.

At this point, the operator, if desired, can clear offsets from prior calibrations. Offsets are inputs which result because of differences in temperatures ascertained by sensors 21 fixed within the equipment and those actually measured at the integrated circuits having the thermocouples embedded therein during a prior calibration. Frequently, it is desirable to start calibration with prior offsets remaining within the system. Quicker calibration may, thereby, result.

At this point, the computer 10, having been programmed appropriately, responds to the decision with respect to the type of calibration (that is, standard calibration or custom calibration). Based upon that selection, the computer 10 will define the set points.

It will be understood that at this point, the involvement of the operator is completed. The individual, having initiated operation of automatic calibration can begin the performance of other tasks, and calibration will continue until concluded automatically.

For discussion hereinafter, it will be assumed that "Standard calibration" has been chosen. Further, it will be assumed that, under such calibration, the system has been set for calibration at +5° and −45°, verification at −55°, calibration at +70° and +125°, and verification at +155°.

The computer 10 will, at this point, initiate calibration at +5°. It will be noted that, in FIG. 2c, once calibration for one set point is completed, the system will loop back as indicated by the "D" in a circle. The system loops back to the "D" in a circle illustrated in FIG. 2a.

When calibrating to any particular set point, however, a timer is started. Typically, the timer would run for fifteen minutes. If the actual temperature sensed in a particular zone is +23°, and the system 8 were calibrating for a set point of +5°, assuming utilization of a gas/electrical heating system, a volume of gas would be "dumped" into the chamber to ensure cooling down of the location to a temperature below +5°, thereafter, electrical heaters will heat the chamber so as to tend to achieve the +5° temperature.

At the expiration of the fifteen minute period, the system reads the temperature sensed by the thermocouples 18 embedded in the integrated circuit devices at the designated zones (typically, ten zones). The system 8 reads the temperature sensed by fixed sensors 3 within the tray and displays it on the console 10.

At this point in time, the screen is updated. If an error has occurred (for example, as evidenced by an open sensor), the computer console 10 can turn off the heat. The error is recorded and the flow goes to the "E" within the circle at the end of the flow diagram near the bottom in FIG. 2c.

If no error has occurred, then the difference between sensed temperature and set point temperature is compared. If a zero differential has not been achieved, the system goes back to the "B" within the circle near the bottom of FIG. 2a, and the timer continues to run until a period of fifteen minutes expires.

If the differential has achieved zero, calibration is automatically started. The computer 10 again reads the thermocouples 18 and "reads the display". Errors are again checked for. If an error has occurred, the temperature is shut down, the error is recorded, and the system proceeds to the location on the flow diagram of "E" within a circle near the bottom of FIG. 2c.

If no error has occurred, the screen is updated. A second timer is employed for calibration. Typically, the second timer would run on a three-minute schedule. The system calibrates every three minutes. If the timer does not reach three minutes, the system jumps back up to the "C" within a circle immediately after the "start calibration" block near the center of FIG. 2b, and the calibration phase is performed again. The system will continue to operate within this loop until a three-minute period has elapsed (that is, until the calibration timer lapses).

Once the calibration timer has lapsed, the system checks the thermocouple in each of the zones in order to ascertain actual temperature. If calibration is for +5° and a particular thermocouple senses +5.5°, the sensed condition is deemed unacceptable since, normally, calibration must be within + or −0.3° from the set point. Consequently, it will be determined that the system is calibrated to too hot a temperature. The computer 10 will, automatically, initiate actuation of the temperature controller board 24 to effect cooling in such a case.

The actual temperature sensed is checked to be within the plus or minus 0.3° tolerance, and the other thermocouples 18 in different zones are also checked. The system 8 will, at this point in time, loop around sequentially a sufficient number of times until all zones are checked.

Once it is determined that all zones are within tolerance, the computer 10 starts a third timer to ensure that all zones stay within a range of the tolerance for a period of, for example, twelve minutes. If this does not occur, the system loops back to the "C" within a circle midway down in FIG. 2b, and calibration is reinitiated.

The third timer is set for the period of time to ensure that the temperature in a particular zone does not vary more than + or −0.1° during the period of the timer. If variation of more than + or −0.1° occurs, the system loops back to the "C" within a circle midway down in FIG. 2b.

If all zones are properly calibrated within + or −0.3° of set point and the temperatures do not vary by more than + or −0.1° within the period of time during which the timer runs, calibration is complete for the particular set point (that is, in this illustration, +5°). The next set point is then set up, and the system loops back to the "D" within a circle in FIG. 2a, and the fifteen minute timer is started for the new set point. The cycle again is run for the new set point. Once all set points are calibrated for all zones, offsets are determined and recorded.

At this point, full calibration has occurred. Because of the computer sensing, actuation, and implementation of temperature changing, significant time is saved. It has been found that, while manually performed calibration systems involve a period of time, typically, between six and eight hours, calibration employing the present invention can be completed in approximately one-half the time.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for calibrating for temperature an input tray of an integrated circuit handling device, comprising:
   (a) a plurality of fixed sensors mounted at locations along the input tray of the handling device, said fixed sensors adapted to sense temperatures within defined zones corresponding to the locations of the fixed sensors;
   (b) means, corresponding to the various fixed sensors, for adjusting temperature within the defined zones in response to temperature readings sensed by said fixed sensors;
   (c) a plurality of thermocouple sensors, each thermocouple sensor received within an integrated circuit body and being positionable at a location along the input tray of the handling device closely proximate the location of a fixed sensor to sense the actual temperature to which an integrated circuit device passing along the input tray would be exposed as it passes through a zone defined by a corresponding fixed sensor; and
   (d) means for correcting for temperature each fixed sensor in response to the actual temperature sensed by a corresponding thermocouple sensor, regardless of the temperature reading sensed by the fixed sensor.

2. Apparatus in accordance with claim 1 wherein said correcting means comprises automatic processing means programmed to receive information from said thermocouple sensors and to adjust stated sensed temperatures of corresponding fixed sensors to correspond to actual temperatures sensed by said thermocouple sensors.

3. Apparatus in accordance with claim 2 wherein said processing means comprises a personal computer.

* * * * *